United States Patent [19]

Kim et al.

[11] Patent Number: 5,777,943
[45] Date of Patent: Jul. 7, 1998

[54] COLUMN DECODER FOR A SEMICONDUCTOR MEMORY DEVICE

[75] Inventors: Gyu-Hong Kim; Woo-Seoup Jeong. both of Seoul, Rep. of Korea

[73] Assignee: Samsung Electronics Co., Ltd., Suwon, Rep. of Korea

[21] Appl. No.: 686,062

[22] Filed: Jul. 24, 1996

[30] Foreign Application Priority Data

Jul. 25, 1995 [KR] Rep. of Korea .................. 95-22057

[51] Int. Cl.$^6$ ................................................ G11C 8/00
[52] U.S. Cl. ..................... 365/230.06; 365/230.08; 365/233
[58] Field of Search ................ 365/230.06, 230.08, 365/233, 233.5

[56] References Cited

U.S. PATENT DOCUMENTS

| | | | |
|---|---|---|---|
| 4,931,998 | 6/1990 | Ootani et al. | 365/230.06 |
| 5,233,565 | 8/1993 | Wang | 365/230.06 |
| 5,428,577 | 6/1995 | Yumitori et al. | 365/230.06 |
| 5,579,268 | 11/1996 | Seo et al. | 365/230.06 |
| 5,586,080 | 12/1996 | Raad et al. | 365/230.06 |

*Primary Examiner*—Son T. Dinh
*Attorney, Agent, or Firm*—William L. Geary, Jr.

[57] ABSTRACT

A column decoder for a semiconductor memory device capable of a high-speed data access, such as in a synchronous memory. The column decoder receives and decodes a column address signal and produces a column select signal for driving a corresponding column select gate in accordance with the result of decoding. The column decoder includes a pre-decoder composed of a first pre-decoding section for pre-decoding the column address signal and producing at least one asynchronous pre-decoded signal, and a second pre-decoding section for pre-decoding the column address signal in response to a clock signal and producing at least one synchronous pre-decoded signal and enable signal; and a main decoder for producing at least one column select signal which is activated in response to the enable signal and is de-activated in response to a combination of the synchronous and asynchronous pre-decoded signals.

13 Claims, 6 Drawing Sheets

COLUMN DECODER FOR A SEMICONDUCTOR MEMORY DEVICE

FIELD OF THE INVENTION

The present invention relates generally to a semiconductor memory device. In particular, it relates to a column decoder which designates a specific column select gate relating to data transmission in response to an input of a column address.

BACKGROUND OF THE INVENTION

In a typical semiconductor memory device, in order to input/output data into/from a specific memory cell in a memory device, the specific memory cell should be designated by inputting and decoding a row address and a column address. When the specific memory cell is designated in a read operation, a charge distribution operation is performed with respect to data read out from the designated memory cell to a bit line, and the read-out data is amplified by a sense amplifier. The amplified data is transmitted to an input/output line through a column select gate, and then it is output from the memory chip via associated output circuits. The read operation of one-bit data stored in the specific memory cell is completed by the above-described process. The column decoder turns on the selected column select gate by receiving and decoding the column address.

In order to simplify the complexity of the decoding operation, a typical column decoder pre-decodes a portion of the column address prior to the decoding operation. It is well known in the art that such a pre-decoding operation performed by a column pre-decoder has been adopted in most memory devices. Consequently, in a broad sense, a column decoder is composed of a column pre-decoder and a column main decoder.

Figure 1:
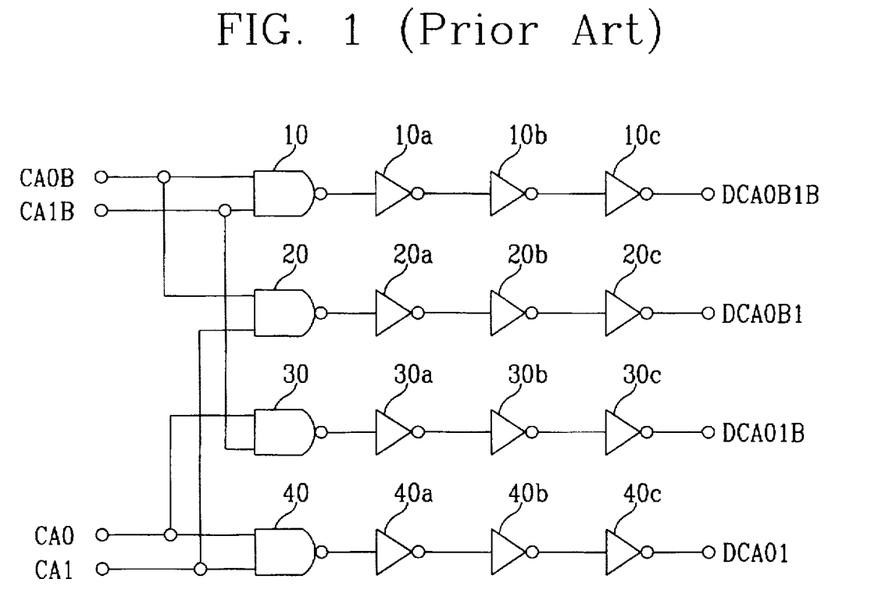
FIG. 1 is a schematic circuit diagram of a conventional column pre-decoder for a semiconductor memory device.
Figure 2:
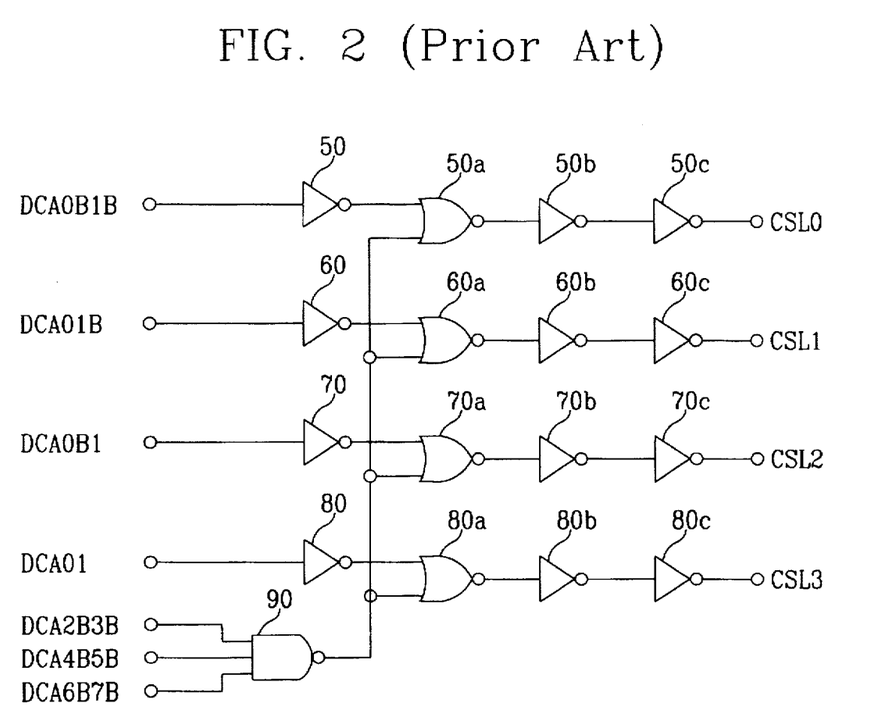
FIG. 2 is a schematic circuit diagram of a conventional column main decoder for a semiconductor memory device.

FIGS. 1 and 2 are schematic circuit diagrams of the conventional column pre-decoder and column main decoder, respectively.

Referring to FIG. 1, the conventional column pre-decoder receives column addresses CA0 and CA1 and their inverted signals CA0B and CA1B, and produces four decoded signals DCA0B1B, DCA0B1, DCA01B, and DCA01. It can be seen that signal DCA0B1B results from the combination of CA0B and CA1B, signal DCA0B1 results from the combination of CA0B and CA1, etc. Practically, the column pre-decoder of FIG. 1 represents a CA01 series (CA0 and CA1) column pre-decoder among four column pre-decoders for producing pre-decoded signals of CA01 series, CA23 series (CA2 and CA3), CA45 series (CA4 and CA5), and CA67 series (CA6 and CA7), respectively. The three column decoders for CA2 to CA7 are not shown.

Referring to FIG. 2, the conventional column main decoder receives pre-decoded signals output from four pre-decoders, and produces a final decoded signal CSLi (where i=0, 1, 2, or 3) by the combination of the input pre-decoded signals. The decoded signal CSLi is used as a column select line signal, which is a type of data transmission control signal. The decoded signal CSLi enables data transmission between the bit line and the input/output line by turning on the column select gate which is coupled between the bit line and the input/output line.

The operation of the conventional column decoder will be explained in detail with reference to FIGS. 1 and 2.

The column addresses CA0 and CA1 and their inverted signals CA0B and CA1B are input to the CA01 series column pre-decoder as shown in FIG. 1, and then decoded through four respective paths, each of which is composed of a NAND gate and inverters, so that the four pre-decoded signals DCA0B1B, DCA01B, DCA0B1, and DCA01 are generated by the column pre-decoder. The pre-decoded signals are transferred to the main decoder shown in FIG. 2, which becomes active when all of the input pre-decoded signals of CA23 series DCA2B3B (resulting from the combination of CA2B and CA3B), CA45 series DCA4B5B, and CA67 series DCA6B7B, which have been pre-decoded from the column addresses CA2 to CA7, are at a "high" level. Specifically, the main decoder becomes enabled when the pre-decoded signals DCA2B3B, DCA4B5B, and DCA6B7B are all in a "high" level, and at this time, one of the column select line signals CSL0 to CSL3 becomes "high", i.e., becomes active, in accordance with the CA01 series pre-decoded signals DCA0BIB, DCA01B, DCA0B1, and DCA01.

Figure 3:
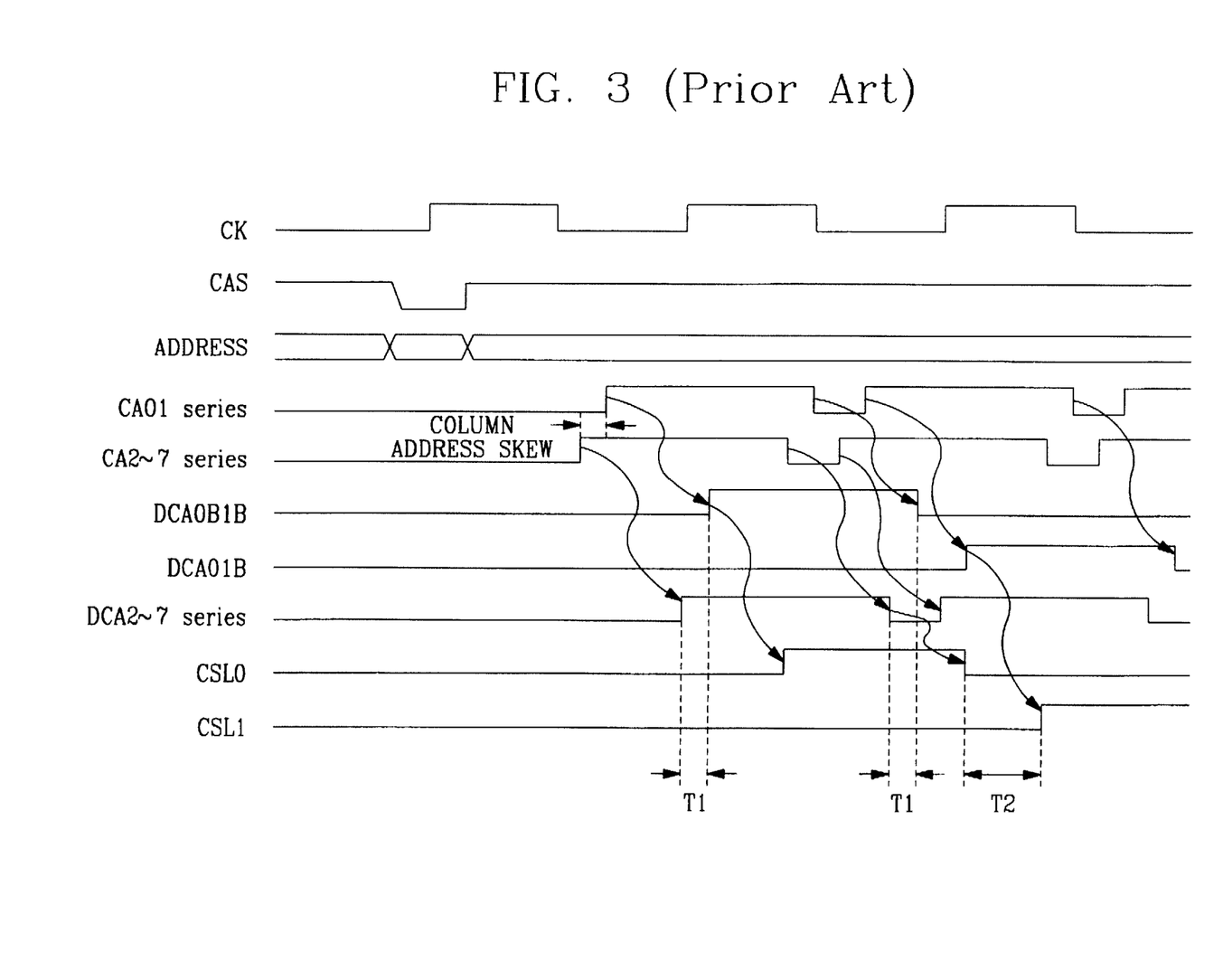
FIG. 3 is a timing diagram explaining the operation of the conventional column decoder.

FIG. 3 is a timing diagram explaining the operation of the column pre-decoder and the column main decoder of FIGS. 1 and 2. Referring to FIGS. 2 and 3, according to the construction of the conventional column decoder, the time point when the column select line CSLi is enabled presents the time point when all the selected pre-decoded signals DCA01, DCA2 to DCA7 become "high". Thus, the column select line CSLi becomes enabled when the final pre-decoded signal among the selected pre-decoded signals DCA01, DCA2 to DCA7 becomes "high". Referring to FIG. 3, the DCA2 series to DCA7 series signals go "high" prior to the time the signals DCA0B1B and DCA01B go "high". Because all of these signals must be high before a column select line CSLi goes "high," there may be some delay in generating the column select signal CSLi. Accordingly, the conventional column decoder has the drawback in that the column select line CSLi becomes enabled after waiting for the delay from all the address skews related to CA0 to CA7. Further, as shown in the drawing, the time point when the column select line CSLi becomes disabled is equal to the time point when a firstly disabled signal among the selected pre-decoded signals DCA0 I, DCA2 to DCA7 is received. Referring to the drawing, since the signals DCA2 to DCA7 are disabled first, thereby disabling the column select line CSLi, a drawback caused by the construction of the conventional column decoder is that there is a decreased time period for which the column select line CSLi is enabled. As the width of the CSLi signal is reduced, data may not be completely written in the memory cell in a write operation, or data stored in the memory cell may not be completely read out from the memory cell in a read operation.

In other words, in the conventional column decoder, the CSLi signal for controlling the column select gate is directly controlled by all the column addresses, and this causes the on-time of the column select gates to be reduced. Specifically, the time when the CSLi signal becomes active depends on the time when the column address CAi becomes active. Also, since only one CSLi signal is selected in the event that all the column addresses CAi become "high", even a minute skew between the column addresses CAi limits the time when the CSLi signal is active, thus deteriorating the high-speed operation of the column decoder. Accordingly, in the event that the conventional column decoder having the above-described characteristics is employed in synchronous memory devices in which the column address is synchronized with a system clock and thus rapidly changed in sequence, the on-time of the column select gate is also synchronized with the period of the system clock and thus shortened. As a result, the conventional column decoder is not suitable for high-speed data access in high-frequency semiconductor memory devices.

SUMMARY OF THE INVENTION

It is an object of the present invention to provide an improved column decoder for a semiconductor memory device which enables a high-speed access of data and allows the selection of a particular column by sufficiently maintaining the enable time of the column select line.

It is another object of the present invention to provide an improved column decoder for a semiconductor memory device which operates under the control of a system clock and produces a pre-decoded address signal and a pulse signal having a predetermined pulse width.

It is still another object of the present invention to provide an improved column decoder for a semiconductor memory device which is enabled by a predetermined pulse signal and disabled by a pre-decoded address signal.

It is still another object of the present invention to provide an improved column decoder for a semiconductor memory device which is enabled and disabled by a predetermined pulse signal and a pre-decoded address signal, respectively, and which has a latch means for latching an enable state of a finally decoded signal.

In order to achieve the above objects, the present invention provides a column decoder for a semiconductor memory device for receiving and decoding a column address signal and producing a column select signal for enabling a corresponding column select gate in accordance with a result of decoding, said column decoder comprising: a pre-decoder for pre-decoding said column address signal in response to a clock signal, and producing at least one synchronous pre-decoded signal and enable signal; and a main decoder for producing a column select signal which becomes active in response to said at least one enable signal and which becomes non-active in response to a combination of said at least one synchronous pre-decoded signal.

In another aspect of the present invention, there is provided a column decoder for a semiconductor memory device for receiving and decoding a column address signal and producing a column select signal for driving a corresponding column select gate in accordance with a result of decoding, said column decoder comprising: a pre-decoder having a first pre-decoding means and a second pre-decoding means, said first pre-decoding means pre-decoding said column address signal and producing at least one asynchronous pre-decoded signal, said second pre-decoding means pre-decoding said column address signal in response to a clock signal and producing at least one synchronous pre-decoded signal and enable signal; and a main decoder for producing at least one column select signal which becomes active in response to said at least one enable signal and which becomes non-active in response to a combination of said synchronous and asynchronous pre-decoded signals.

Preferably, said second pre-decoding means comprises at least one pre-decoding path. Each pre-decoding path comprises decoding means for pre-decoding said column address signal; latch means for latching a pre-decoded signal in response to said clock signal; output means for outputting a signal latched in said latch means as said synchronous pre-decoded signal; and rising edge detect means for detecting a rising edge of said latched signal in response to said clock signal and producing a detected signal as an enable or "auto-pulse" signal.

The main decoder comprises a first combination means for combining said asynchronous pre-decoded signals and producing a first combination signal; and at least one main decoding path. Each main decoding path comprises a second combination means for combining said first combination signal and said synchronous pre-decoded signal and producing a pre-charge signal; driving means for pre-charging a first node in response to said pre-charge signal and for activating said first node in response to said first combination signal and said enable signal; output latch means for latching a state of said first node; and output buffer means for outputting a signal latched in said output latch means as said column select signal.

BRIEF DESCRIPTION OF THE DRAWINGS

The above objects, other features and advantages of the present invention will become more apparent by describing preferred embodiments thereof with reference to the accompanying drawings, in which.

DETAILED DESCRIPTION OF PREFERRED EMBODIMENTS

Figure 4:
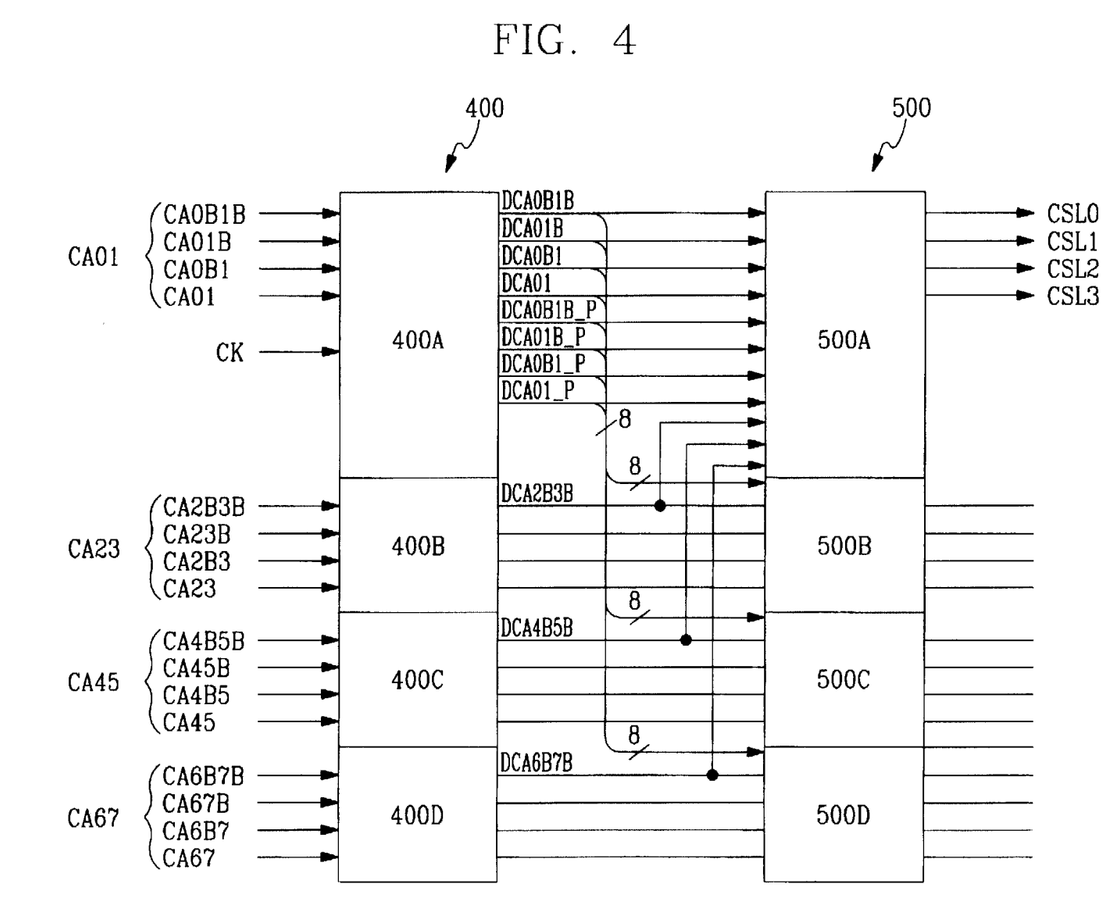
FIG. 4 is a block diagram of a column decoder for a semiconductor memory device according to the present invention.

FIG. 4 shows the construction of the column decoder according to the present invention. In FIG. 4, the numeral 400 denotes a column pre-decoder, and 500 denotes a column main decoder. The column pre-decoder 400 comprises a second pre-decoding section 400A and a first pre-decoding section consisting of 400B, 400C, and 400D. Pre-decoding sections 400A to 400D each correspond with a bit-pair of an eight-bit column address signal.

The second pre-decoding section 400A produces synchronous pre-decoded signals DCA0B1B, DCA01B, DCA0B1 and DCA01 and enable or "auto-pulse" signals DCA0B1B_P, DCA0B1_P, DCA01B_P, and DCA01_P in response to a clock signal CK. The first pre-decoding section 400B, 400C, and 400D has the same construction as the conventional pre-decoder as shown in FIG. 1, which receives no clock signal. The main decoder 500 comprises a second main decoding section 500A and a first main decoding section consisting of 500B, 500C, and 500D.

As shown in FIG. 4, the most obvious difference between the construction of the pre-decoder according to the present invention and that of the conventional pre-decoder is that the pre-decoder according to the present invention produces a decoded signal by the control of an external system clock CK, and it produces an auto-pulse signal, such as DCA0B1B_P, having a predetermined period. The clock signal CK is not routed to all of the column pre-decoders, because the loading on the clock signal CK would increase, thereby increasing the overall delay time in generating the column select signal CSLi. In order to solve this problem, a pre-decoder according to the present invention is constructed so that only the CA01 series predecoding section (the second pre-decoding section 400A) is under the control of the system clock, but the first pre-decoding sections 400B, 400C, and 400D of the CA23 series, CA45 series, and CA67 series respectively, are not under the control of the system clock. Accordingly, the loading of the clock can be reduced below a ratio of four to one.

Figure 5:
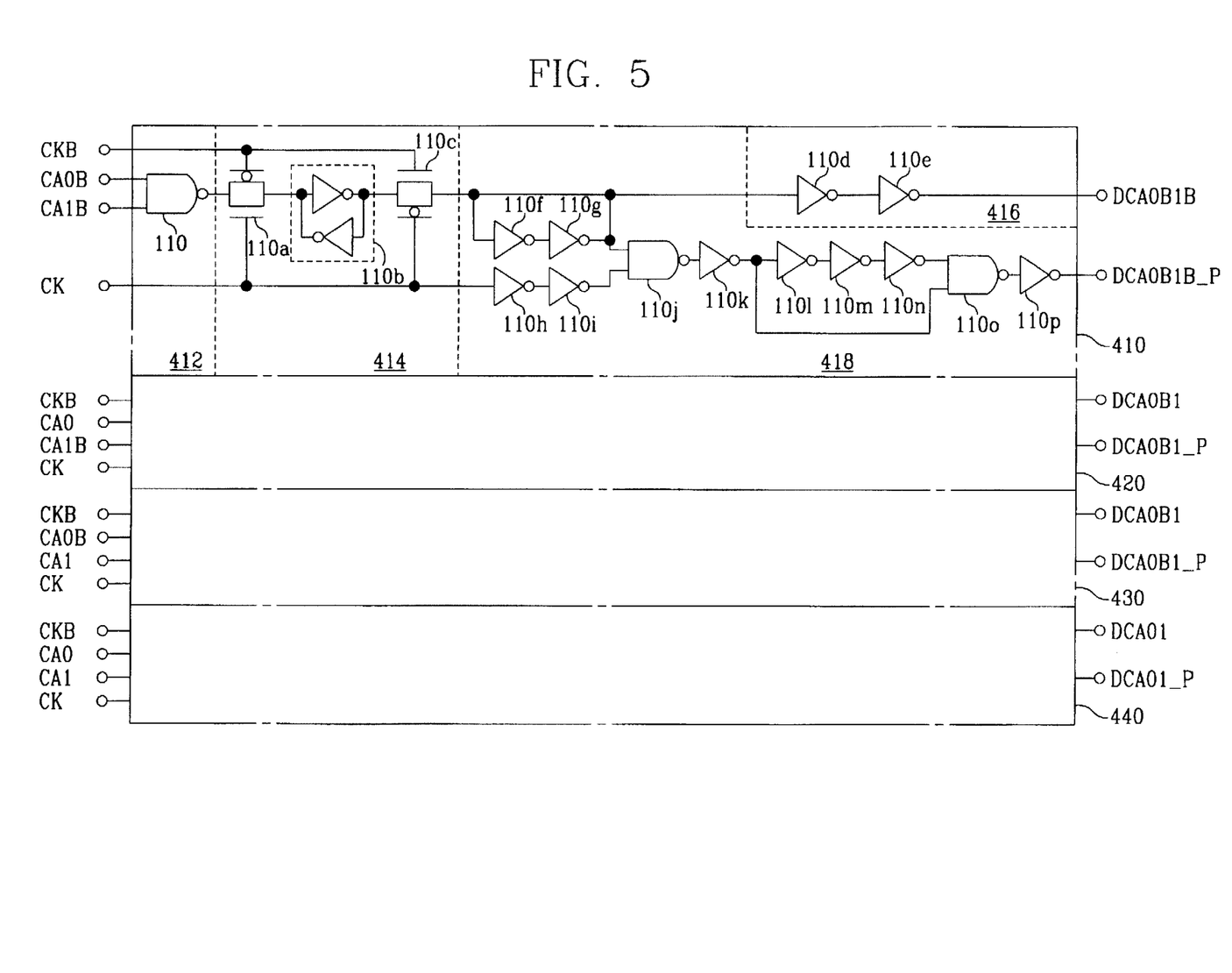
FIG. 5 is a schematic circuit diagram of the column pre-decoder of FIG. 4.

Referring to FIG. 5, the second pre-decoding section 400A according to the present invention comprises four pre-decoding paths 410, 420, 430, and 440. Pre-decoding path 410 comprises a decoding means 412 composed of NAND gate 110 for pre-decoding the column address signal, a latch means 414 composed of an input transmission gate 110a, a latch circuit 110b, and an output transmission gate 110c for latching the pre-decoded signal in response to the clock signal CK and inverted clock signal CKB, an output means 416 composed of cascade-connected inverters 110d and 110e for outputting the signal latched in the latch means 414 as the synchronous pre-decoded signal DCA0B1B, and a rising edge detect means 418 composed of inverters and NAND gates 110f to 110p for detecting a rising edge of the latched signal in response to the clock signal CK and producing a detected signal as the enable signal DCA0B1B_P. The construction of other pre-decoding paths 420, 430, and 440 are identical with that of the pre-decoding path 410 as described above, and the detailed explanation thereof will be omitted.

Figure 6:
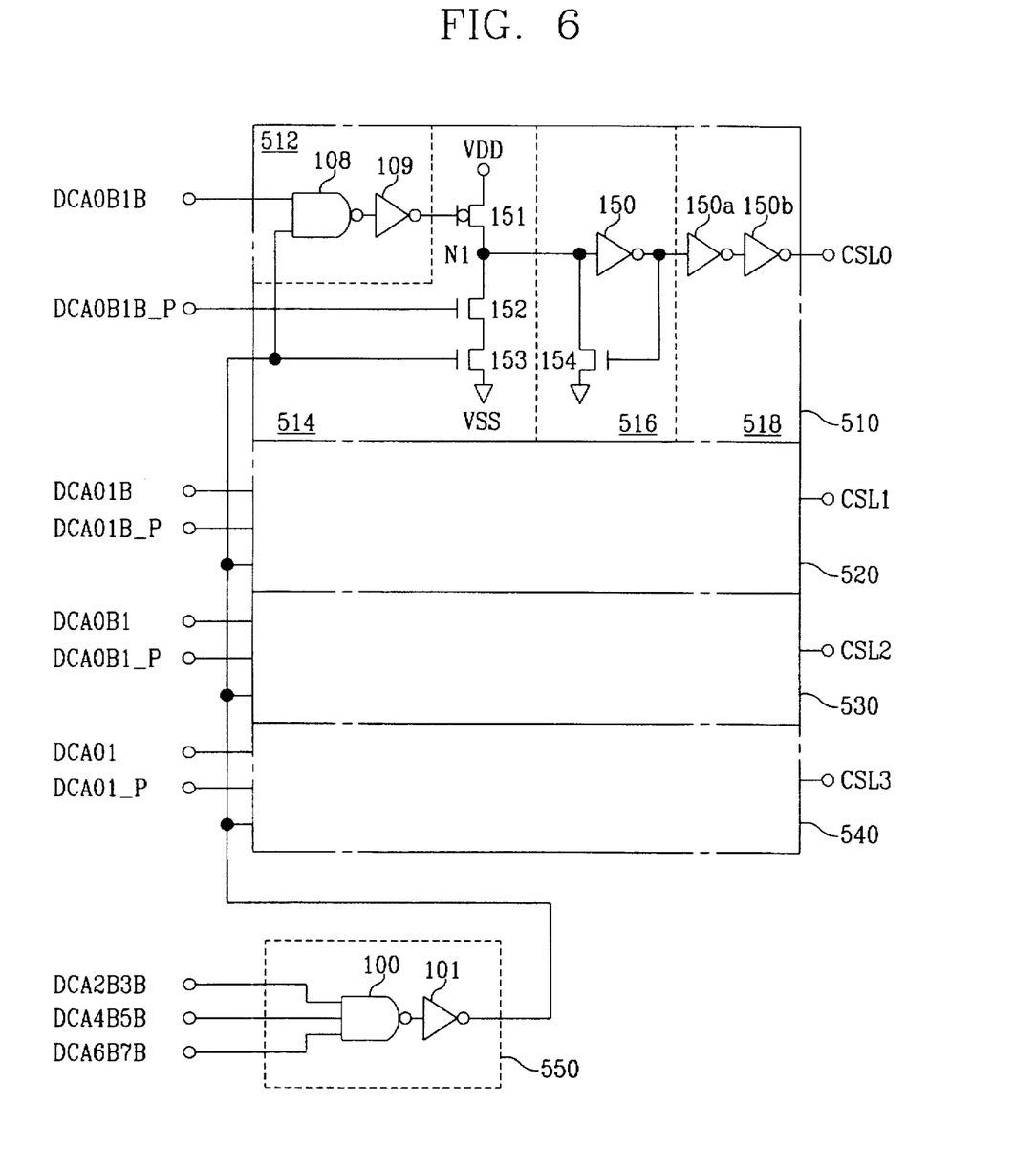
FIG. 6 is a schematic circuit diagram of the column main decoder of FIG. 4.

Referring to FIG. 6, the second main decoding section comprises a first combination means 550 composed of a NAND gate 100 and an inverter 101 for combining the asynchronous pre-decoded signals DCA2B3B, DCA4B5B, and DCA6B7B and producing a first combination signal, a second combination means 512 composed of a NAND gate 108 and an inverter 109 for combining the first combination signal and the synchronous predecoded signal and producing a pre-charge signal, a driving means 514 for pre-charging a first node N1 in response to the pre-charge signal and for activating the first node N1 in response to the first combination signal and the enable signal DCA0B1B_P, an output latch means 516 composed of an inverter 150 and an NMOS transistor 154 for latching the state of the first node N1, and an output buffer means 518 composed of two inverters 150a and 150b for outputting the signal latched in the output latch means 516 as the column select signal CSL0.

The driving means 514 comprises a first transistor 151, coupled between a power supply voltage VDD and the first node N1, for pre-charging the first node N1 with the power supply VDD in response to the synchronous pre-decoded signal DCA0B1B, a second transistor 153, coupled between the first node N1 and a ground voltage VSS, for being switched in response to the first combination signal, and a third transistor 152, coupled between the first node N1 and the second transistor 153, for being switched in response to the enable signal DCA0B1B_P. The output latch means 516 maintains the column select line CSLi in the selected state until a change in the column address is propagated through the pre-decoder and decoder.

Figure 7:
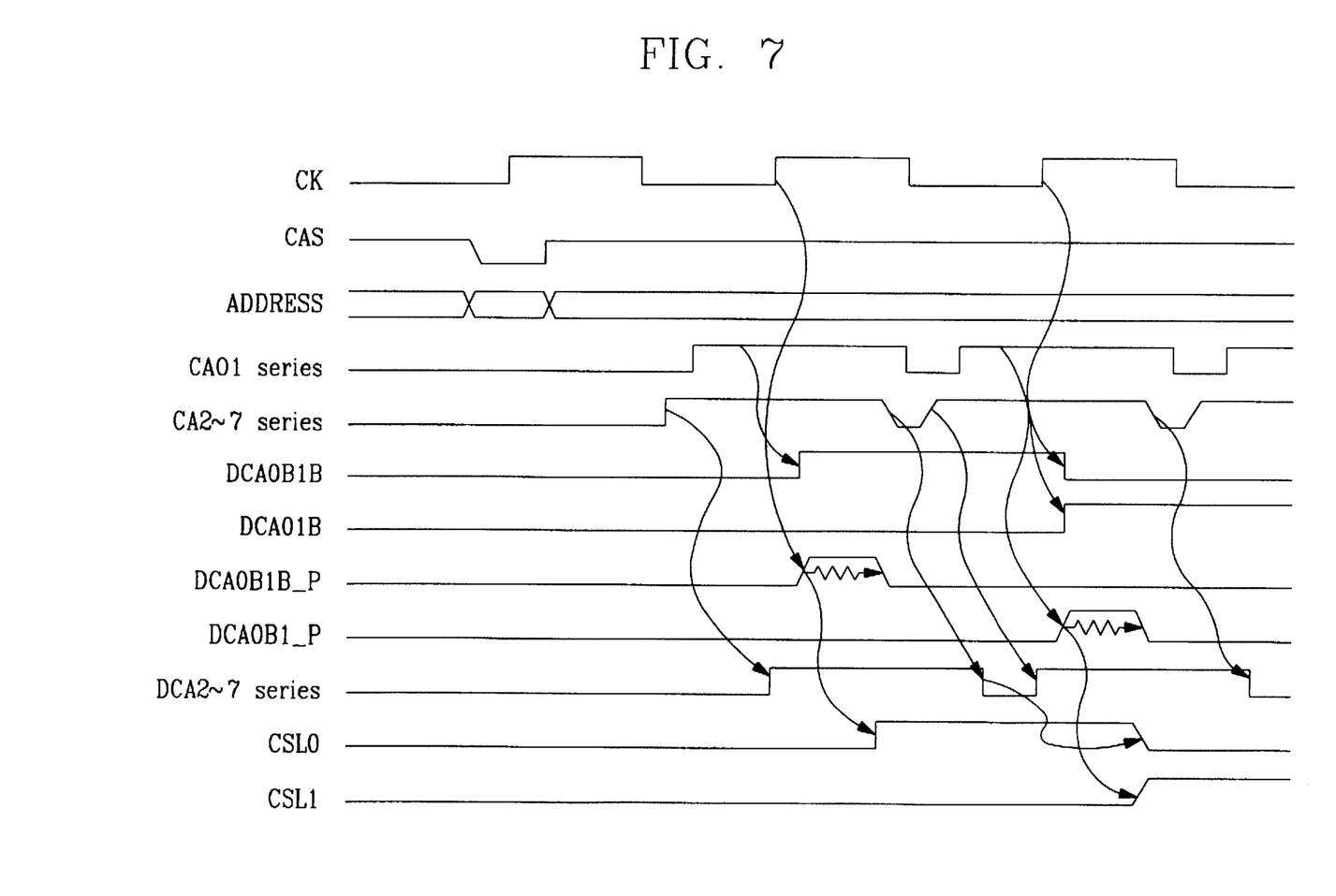
FIG. 7 is a timing diagram explaining the operation of a column decoder according to the present invention.

FIG. 7 is a timing diagram explaining the operation of the column decoder according to the embodiments of FIGS. 4 to 6. Referring to FIG. 7, according to the present invention, the time point when the column select line CSL0 is enabled represents the time point when the auto-pulse signal DCA0B1B_P generated in the CA01 series pre-decoder becomes "high", and thus it is not necessary to consider all the address skews as in the conventional column decoder. Specifically, the enabled state of the column select line CSL0 has no direct relation with the pre-decoded address signal, but is determined by the auto-pulse signal generated in a specific series pre-decoder DCA01. Accordingly, the time point when a column select line CSLi is enabled to a "high" level can be precisely controlled.

Meanwhile, as shown in FIG. 7, the column select line CSLi is disabled after the pre-decoded address signal is received in the same manner as the conventional column decoder. In other words, the column select line CSLi becomes disabled to a "low" level when the first disabled signal among the pre-decoded address signals is received. According to the present invention, the enabled state of the column select line CSLi is determined by the auto-pulse signal, without reference to the skew of the address signal, thereby solving a problem found in a conventional column decoder with respect to the shortened pulse-width of the column select line signal CSLi.

Specifically, in the event that a read operation is performed in a synchronous memory device by a column decoder according to the present invention, a read command is applied at a first clock and a column address is applied as shown in FIG. 7. Accordingly, an internal column address signal CAi is produced, which includes column addresses CA0 and CA1. If it is assumed that both the signals CA0B and CA1B are in a "high" level, the signals DCA0B1B and DCA0B1B_P are output at a "high" level. (See FIG. 5.) Also, the first pre-decoding section is not under the control of the system clock CK (see FIG. 4), and thus may be the same as the conventional pre-decoder of FIG. 1.

As shown in FIGS. 5 and 7, the second pre-decoding section receives the column address signal CAi, and in synchronism with the clock CK, it produces the signals DCAi. Consequently, as shown in FIG. 6, the main decoder receives the selected DCA01 series signals and the selected DCA2 to DCA7 series signals, causing only one column select line CSLi to become "high".

Referring back to FIG. 3, it appears to be quite difficult to eliminate the speed loss and skew related to the T1 period. However, according to the present invention, all of the DCA series skews are not required to be considered, because the column select line is enabled by the auto-pulse signal generated in the DCA01 series pre-decoder. Further, referring to FIG. 3, a skew period T2 is caused by the various skews in the signals input to and generated by the DCA series pre-decoders. Accordingly, a sufficient width of the column select signal cannot be obtained with a the conventional column decoder. According to the present invention, the above problems are minimized or eliminated because the enable time of the column select signal CSLi is determined by the auto-pulse signal generated in the DCA01 series pre-decoder, although the disable time of CSLi is determined by the outputs of all of the DCA series pre-decoders. The advantages of the present invention described above may be understood with reference to the timing diagram of FIG. 7.

While the present invention has been described and illustrated herein with reference to the preferred embodiments thereof, it will be understood by those skilled in the art that various changes in form and details may be made therein without departing from the spirit and scope of the invention. For example, the present invention is not limited to decoders which operate on column addresses of only eight bits, and the enable time of the CSLi signal may be determined by a synchronous signal other than the system clock CK.

We claim:

1. A column decoder for a semiconductor memory device, comprising:

a pre-decoder responsive to a column address signal and a clock signal, wherein said pre-decoder generates a plurality of synchronous pre-decoded signals and at least one enable signal; and a main decoder connected to said pre-decoder and responsive to said pre-decoded signals and to said enable signal, wherein said main decoder generates a column select signal which becomes active in response to said at least one enable signal and which becomes inactive in response to said plurality of synchronous pre-decoded signals.

2. A column decoder for a semiconductor memory device, comprising:

a pre-decoder responsive to a column address signal and a clock signal;

said pre-decoder comprising a first pre-decoding circuit and a second pre-decoding circuit; wherein said first pre-decoding circuit receives said column address signal and generates at least one asynchronous pre-decoded signal in response thereto; and said second pre-decoding circuit receives said column address signal and said clock signal, and generates at least one synchronous pre-decoded signal and at least one enable signal in response thereto; and a main decoder connected to said pre-decoder and responsive to said pre-decoded signals and to said enable signals, wherein said main decoder generates a column select signal which becomes active in response to a combination of said enable signals and said synchronous pre-decoded signals, and which becomes inactive in response to a combination of said asynchronous pre-decoded signals and said synchronous pre-decoded signals.

3. A column decoder as in claim 2, wherein said second pre-decoding circuit comprises at least one pre-decoding path, said pre-decoding path comprising:

a decoding circuit responsive to said column address signal, thereby generating a pre-decoded signal;

a latch coupled to an output of said decoding circuit and to said clock signal, wherein said latch latches said pre-decoded signal in response to said clock signal, thereby generating an internal synchronous pre-decoded signal;

a buffer coupled to an output of said latch, for generating said synchronous pre-decoded signal in response to said internal synchronous pre-decoded signal; and a rising edge detector coupled to said output of said latch and to said clock signal, wherein said rising edge detector generates an enable signal in response to both said clock signal and a rising edge of said internal synchronous pre-decoded signal.

4. A column decoder as in claim 3, wherein said latch latches said pre-decoded signal in response to a first state of said clock signal, and outputs said latched signal in response to a second state of said clock signal, thereby generating said internal synchronous pre-decoded signal.

5. A column decoder as in claim 2, wherein said main decoder comprises a first combination circuit for combining said asynchronous pre-decoded signals and generating a first combination signal, and at least one main decoding path, said main decoding path comprising:

a second combination circuit for combining said first combination signal and said synchronous pre-decoded signal, thereby producing a pre-charge signal;

a driving circuit responsive to said pre-charge signal, said synchronous pre-decoded signal, and said enable signal, and having an output connected to a first node, whereby said driving circuit both pre-charges said first node in response to said pre-charge signal and activates said first node in response to both said first combination signal and said enable signal;

an output latch having an input connected to said first node, thereby latching a state of said first node; and an output buffer having an input connected to an output of said latch, thereby generating said column select signal in response to said output of said latch.

6. A column decoder as in claim 5, wherein said driving circuit comprises:

a first transistor having a source and drain coupled between a power supply voltage and said first node, and a gate coupled to said pre-charge signal;

a second transistor, having a source and drain coupled between said first node and a third transistor, and a gate coupled to said enable signal; and said third transistor, having a source and drain coupled between said second transistor and a reference voltage, and a gate coupled to said first combination signal.

7. A column decoder as in claim 6, wherein said output latch comprises:

an inverter having an input coupled to said first node; and a fourth transistor, having a source and drain coupled between said first node and a reference voltage, and a gate coupled to an output of said inverter.

8. A column decoder as in claim 4, wherein said main decoder comprises a first combination circuit for combining said asynchronous pre-decoded signals and generating a first combination signal, and at least one main decoding path, said main decoding path comprising:

a second combination circuit for combining said first combination signal and said synchronous pre-decoded signal, thereby producing a pre-charge signal;

a driving circuit responsive to said pre-charge signal, said synchronous pre-decoded signal, and said enable signal, and having an output connected to a first node, whereby said driving circuit both pre-charges said first node in response to said pre-charge signal and activates said first node in response to both said first combination signal and said enable signal;

an output latch having an input connected to said first node, thereby latching a state of said first node; and an output buffer having an input connected to an output of said latch, thereby generating said column select signal in response to said output of said latch.

9. A column decoder as in claim 8, wherein said driving circuit comprises:

a first transistor having a source and drain coupled between a power supply voltage and said first node, and a gate coupled to said pre-charge signal;

a second transistor, having a source and drain coupled between said first node and a third transistor, and a gate coupled to said enable signal; and said third transistor, having a source and drain coupled between said second transistor and a reference voltage, and a gate coupled to said first combination signal.

10. A column decoder as in claim 9, wherein said output latch comprises:

an inverter having an input coupled to said first node; and a fourth transistor, having a source and drain coupled between said first node and a reference voltage, and a gate coupled to an output of said inverter.

11. A column decoder as in claim 1, wherein:

said pre-decoder also generates a plurality of asynchronous pre-decoded signals;

said main decoder includes a first combination circuit for combining said asynchronous pre-decoded signals and generating a first combination signal, and at least one main decoding path, said main decoding path comprising:

- a second combination circuit for combining said first combination signal and said synchronous pre-decoded signal, thereby producing a pre-charge signal;
- a driving circuit responsive to said pre-charge signal, said synchronous pre-decoded signal, and said enable signal, and having an output connected to a first node, whereby said driving circuit both pre-charges said first node in response to said pre-charge signal and activates said first node in response to both said first combination signal and said enable signal;
- an output latch having an input connected to said first node, thereby latching a state of said first node; and
- an output buffer having an input connected to an output of said latch, thereby generating said column select signal in response to said output of said latch.

12. A column decoder as in claim 11, wherein said driving circuit comprises:

- a first transistor having a source and drain coupled between a power supply voltage and said first node, and a gate coupled to said pre-charge signal;
- a second transistor, having a source and drain coupled between said first node and a third transistor, and a gate coupled to said enable signal; and
- said third transistor, having a source and drain coupled between said second transistor and a reference voltage, and a gate coupled to said first combination signal.

13. A column decoder as in claim 12, wherein said output latch comprises:

- an inverter having an input coupled to said first node; and
- a fourth transistor, having a source and drain coupled between said first node and a reference voltage, and a gate coupled to an output of said inverter.

\* \* \* \* \*